United States Patent

Swanson et al.

Patent Number: 5,188,705
Date of Patent: Feb. 23, 1993

[54] METHOD OF SEMICONDUCTOR DEVICE MANUFACTURE

[75] Inventors: Lynwood W. Swanson; John M. Lindquist, both of Portland, Oreg.

[73] Assignee: FEI Company, Beaverton, Oreg.

[21] Appl. No.: 685,844

[22] Filed: Apr. 15, 1991

[51] Int. Cl.$^5$ ........................................... H01L 21/306
[52] U.S. Cl. .................... 156/643; 437/225; 204/192.34; 156/635
[58] Field of Search ............ 437/225, 228, 946; 156/643, 635; 204/192.34

[56] References Cited

U.S. PATENT DOCUMENTS

| | | | |
|---|---|---|---|
| 4,397,711 | 8/1983 | Donnelly et al. | 437/946 |
| 4,609,809 | 9/1986 | Yamaguchi et al. | 219/121 EM |
| 4,851,097 | 7/1989 | Hattori et al. | 204/192.33 |
| 4,876,112 | 10/1989 | Kaito et al. | 427/38 |
| 4,994,140 | 2/1991 | Kenzo et al. | 156/643 |

OTHER PUBLICATIONS

Chew et al, "Iodine Ion Milling of Indium-containing Compound Semiconductors", Appl. Phys. Lett. 44 (1), Jan. 1, 1984, pp. 142-144.

Young et al, "Gas-assisted Focused Ion Beam Etching for Microfabrication and Inspection", Microelectronic Engineering 11 (1990), pp. 409-412.

Takado et al, "Chemically-enhanced GaAs Maskless Etching Using A Novel Focused Ion Beam Etching System with a Cholorine Molecular and Radical Beam", Symposia Proceedings, 1986.

Flanders et al, "Reactive Ion Etching of Indium Compounds Using Iodine Containing Plasmas", J. Vac. Sci. Technol. B 8 (6) Nov./Dec. 1990, pp. 1990-1993.

Yamaguchi, H., et al., "Characteristics of Silicon . . . ", J. Vac. Sci. Technol. B3 (1), Jan./Feb. 1985, pp. 71-74.

Ochiai, Y., et al., "Pressure and irradiation angle . . . " J. Vac. Sci. Technol. B3 (1), Jan./Feb. 1985, pp. 67-70.

Primary Examiner—T. N. Quach
Attorney, Agent, or Firm—Dellett, Smith-Hill and Bedell

[57] ABSTRACT

Semiconductor devices are modified and/or repaired by gas enhanced physical sputtering. A focused ion beam is scanned over an area to be removed while iodine vapor is directed toward the same area. The iodine vapor, which is focused by heating solid iodine to a temperature of 30° C. to 50° C., is adsorbed on the surface of the semiconductor device and aids in the selective sputtering of material to be impinged by the ion beam by enabling a chemical reaction at the material's surface. The iodine may be initially handled in a solid state, exhibiting a low vapor pressure, and is then heated to moderate temperatures inside the focused ion beam system without presenting a toxic hazard. The low reactivity of the iodine enables a high degree of contrast in reaction between the area struck by the ion beam and adjoining areas whereby accurate micromachining can be accomplished.

14 Claims, 3 Drawing Sheets

METHOD OF SEMICONDUCTOR DEVICE MANUFACTURE

BACKGROUND OF THE INVENTION

The present invention relates to a micromachining method employing a focused ion beam and particularly to such a method for micromachining solid materials, for example on semiconductor devices, in a selective and environmentally acceptable manner.

Focused ion beam systems are used in forming, shaping or altering microscopic structures in semiconductor devices, or in other solid materials, including semiconductor or insulating surfaces and metal areas providing electrical connection. The focused ion beam can be directed to a very small point on a semiconductor device and then scanned, raster fashion, over a surface where material is to be removed. As an ion impinges on the semiconductor device surface, its momentum is transferred resulting in the removal of one or more surface atoms according to a process called sputtering. By selecting a raster pattern of a given overall shape, for example a horizontal raster pattern, a correspondingly shaped area of surface material can be removed. Often several successive layers of a semiconductor device are removed in a given area in order to reach and possibly sever an underlying layer.

It has been discovered heretofore that the above described physical sputtering process can be enhanced by the introduction of a chemically reactive gas, i.e., fluorine or chlorine. The gas is adsorbed on the surface of the semiconductor device prior to arrival of the ion beam and the gas reacts chemically with the surface material to produce an area of material that is more easily sputtered away. Thus a gas such as chlorine chemically reacts with the surface and forms chlorides which are more easily removed by the ion beam, resulting in a substantial increase in sputtering rates. For instance, an enhancement factor in sputtering of silicon has been reported of approximately fourteen, i.e., the gaseous enhanced sputtering occurs approximately fourteen times as fast as without the introduction of the gas. Gas enhanced sputtering is also less subject to redeposition of sputtered material. The enhancement factor for metal surfaces such as conductive layers in the semiconductor device may be even greater.

However, the introduction of chlorine or fluorine gas creates a safety hazard because of the combined toxicity and high vapor pressure of the gas. Consequently the use thereof is outlawed in many industrial settings. Moreover, handling of tanks of toxic gas at high pressures is awkward even in a carefully monitored laboratory environment.

Furthermore it is difficult to confine the area which is to be machined only to the area upon which the focused ion beam impinges. As indicated above, chlorine gas, for example, is often chemically reactive with the whole surface of the object being formed and may undesirably attack areas adjacent to the ion beam position resulting in a lack of contrast between machined and non-machined areas.

SUMMARY OF THE INVENTION

In accordance with the present invention, the process of shaping an object such as a semiconductor device comprises directing a focused ion beam onto the surface of the object for the removal of material by sputtering. Iodine vapor is supplied within the same chamber and is directed toward the object's surface in order to enable a chemical reaction between the iodine and the surface material in the area where the ion beam is aimed. Because of its limited chemical reactivity, as compared with fluorine or chlorine, iodine would not be expected to produce significant results in regard to increased sputtering yield. However, we have discovered the effectiveness of iodine vapor is substantially equal to that of chlorine while the use of iodine eliminates the manufacturing difficulties and safety hazards heretofore encountered.

Iodine is a solid at room temperature and can be easily conveyed from place to place. Solid iodine crystals can be placed in a container or crucible within the enclosure of the focused ion beam system where the solid iodine is heated to slightly above room temperature to produce a still relatively small vapor pressure but which is nevertheless effective.

Thus, while introduction of iodine in this manner results in the enhancement of the ion beam machining to substantially the same extent as hereinbefore encountered with gaseous chlorine, the safety problems are significantly reduced or eliminated. At the same time the machining process is more accurate. Because of iodine's reduced chemical reactivity as compared with chlorine, the sputtering of material can be more selective. The ion beam itself can more clearly delineate the area being machined inasmuch as adjacent areas are not attacked by the vapor to nearly the same extent.

It is accordingly an object of the present invention to provide an improved method for micro-machining semiconductor devices and other solid materials, said method being characterized by enhanced contrast between machined areas and non-machined areas.

It is a further object of the present invention to provide an improved method for enhanced physical sputtering of semiconductor devices and the like which method is non-hazardous to operating personnel.

It is another object of the present invention to provide an improved method for micromachining semiconductor devices and the like wherein said method is characterized by economy of construction and ease of operation.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DRAWINGS

DETAILED DESCRIPTION

Figure 1:
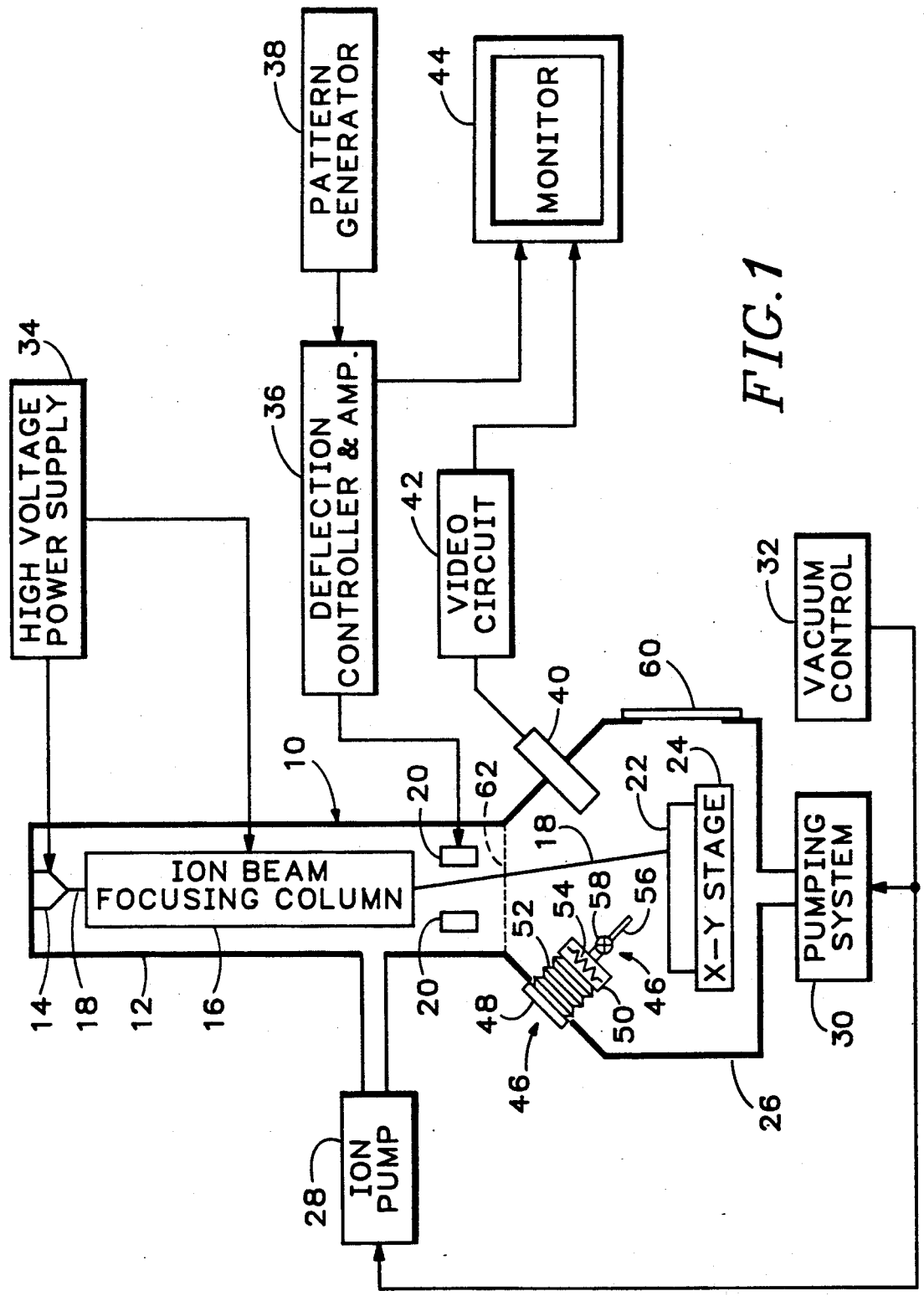
FIG. 1 is a schematic representation of a focused ion beam system adapted for carrying out the process of the present invention.

Referring to FIG. 1, illustrating a focused ion beam system for carrying out the process according to the present invention, an evacuated envelope 10 includes an upper neck portion 12 within which are located a liquid metal ion source 14 and a focusing column 16 which includes extractor electrode means and an electrostatic optical system. Ion beam 18 passes from source 14 through column 16 and between electrostatic deflection means schematically indicated at 20 toward sample 22, which comprises a semiconductor device positioned on movable X-Y stage 24 within lower chamber 26. An ion pump 28 is employed for evacuating neck portion 12. The chamber 26 is evacuated with turbomolecular and mechanical pumping system 30 under the control of vacuum controller 32.

A high voltage power supply 34 is connected to liquid metal ion source 14 as well as to appropriate electrodes in focusing column 16 for forming an approximately 25 keV ion beam 18 and directing the same downwardly. Deflection controller and amplifier 36, operated in accordance with a prescribed pattern such as a raster pattern provided by pattern generator 38, is coupled to deflection plates 20 whereby beam 18 may be controlled to trace out a corresponding pattern on the upper surface of sample 22.

The source 14 typically provides a beam of gallium ions although other ions could be used such as inert gas ions or other metallic ions, for example indium, aluminum, or silicon. The source is capable of being focused into a sub 0.1 micron width beam at sample 22 for either modifying the surface 22 or for the purpose of imaging the surface 22. An electron multiplier 40 used for detecting secondary emission for imaging is connected to video circuit and amplifier 42, the latter supplying drive for video monitor 44 also receiving deflection signals from controller 36.

In accordance with the present invention, the focused ion beam system is further provided with a source 46 for supplying iodine vapor. The source is located inwardly of the side of chamber 26 by translation device 48 adapted for positioning the source via support means within bellows 52. The source 46 in particular comprises a reservoir or crucible 50. A heater 54, which may comprise a membrane type heater, is utilized for raising the temperature of iodine crystals located within reservoir or crucible 50 to a temperature for providing a suitable vapor pressure, i.e., a temperature between approximately 30° C. and 50° C. A transfer tube or nozzle 56 extends from reservoir 50 and is connected thereto via control valve 58 adapted for releasing iodine vapor. The nozzle is extended and translated in orthogonal directions substantially perpendicular to its axis employing translation apparatus 48, so that iodine vapor can be aimed directly toward a region on the top surface of sample 22 wherein material is to be removed by scanning ion beam 18.

A door 60 is opened for inserting sample 22 on stage 24, and also for inserting iodine crystals within reservoir or crucible 50. The door is interlocked so that it cannot be opened if the temperature in reservoir 50 is substantially above room temperature. A gate valve, schematically illustrated at 62, is closed before door 60 can be opened to seal off the ion source and focusing column apparatus. The base pressure within chamber 26 is $1 \times 10^{-6}$ Torr. With the emission of the iodine from the vapor source 46, the chamber background pressure is $1 \times 10^{-5}$ Torr.

Figure 2:
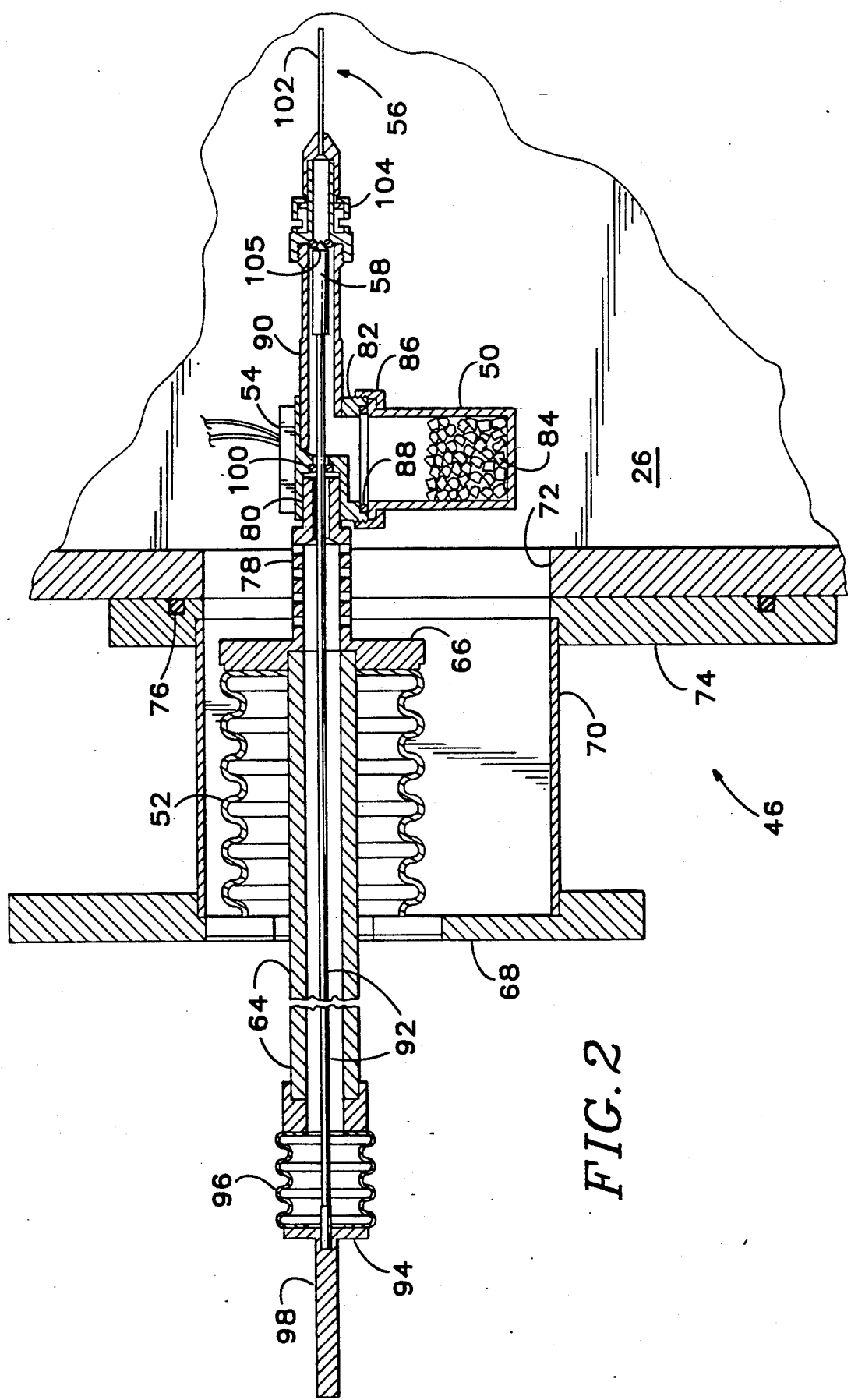
FIG. 2 is a partially broken away, cross sectional view illustrating in greater detail a vapor source for the system of FIG. 1.

Vapor source 46, illustrated schematically in FIG. 1, is depicted in greater detail in FIG. 2. A valve shaft tube 64 is supported by a translation apparatus or manipulator (not shown in FIG. 2) and extends inwardly toward sample chamber 26 through bellows 52 where it joins bellows header 66. The bellows 52 is disposed generally coaxially about tube 64 between header 66 and apertured end plate 68 through which tube 64 also passes. End plate 68 is located outwardly from the wall of chamber 26 forming the cover of cylindrical chamber extension 70 aligned with and positioned over an aperture 72 in the sidewall of chamber 26. The cylindrical chamber extension 70 is joined to a radial flange 74 that is secured to the wall of chamber 26 by means not shown. An O-ring seal 76 is fitted within a circular groove in flange 74 to bear against the sidewall of the sample chamber.

Valve shaft tube 64 communicates with a header tubular housing portion 78 which is aligned with tube 64 and ends in a necked down portion or nozzle 80 received within an upper horizontal passage in container cap 82. Tubular housing portion 78 is provided with a plurality of apertures so that the vacuum within chamber 26 is also maintained within tube 64.

Crucible 50 receives solid iodine as indicated at 84 and has an upper radial flange captured within an annular retainer 86 internally threaded and securable onto cap 82. An O-ring 88 is interposed between the radial flange of crucible 50 and the lower threaded portion of the cap 82. Secured to the top of cap 82 is an electrical heater element 54 provided control current for the purpose of maintaining crucible 50 at a predetermined temperature.

Cap 82 is further supplied with a delivery tube 90 communicating with the interior of the cap and the crucible, and which slideably receives therewithin tapered end valve member 58. Valve member 58 is carried at one end of valve shaft 92 that passes through valve shaft tube 64, tubular housing portion 78, the upper part of cap 82, and the delivery tube 90. Valve member 58 is adapted to be extended and withdrawn by means of longitudinal movement of valve shaft 92, the latter being secured to header 94 of bellows 96 attached to the end of tube 64 farthest from the chamber 26. A handle 98 extending from header 94 can be manipulated in a longitudinal direction either manually or by mechanical means not shown for operating the valve. The shaft 92 also passes through an O-ring seal 100 in a vertical wall at the top of cap 82 where the shaft 92 then extends into the vapor atmosphere from crucible 50.

Nozzle 56 takes the form of a hypodermic needle 102 received in a bayonet joint at the inner end of a tubular fitting 104 threadably received over the end of delivery tube 58. An O-ring seal or valve seat 105 is located at the juncture between delivery tube 90 and fitting 104 such that the tapered end of valve member 58 is positionable thereagainst for closing the valve and preventing delivery of the vapor to the interior of chamber 26.

In order to place the iodine crystals 84 within crucible 50, door 60 (in FIG. 1) is opened and annular retainer 86 is threadably disengaged from cap 82 whereby the crucible 50 can be removed downwardly. Iodine crystals 84 can then be placed in crucible 50 after which the crucible is again positioned below cap 82 and retainer 86 is employed to secure the crucible in the position shown. Door 60 can be opened and material can be inserted in crucible 50 only when the temperature thereof (measured by means not shown) is approximately room temperature, e.g. 29° C. or less. Also, door 60 can be operated only when chamber 26 is returned to ambient pressure, with gate valve 62 in place to seal off the upper part of the apparatus. After placement of material in crucible 50 (and presumably after placement of sample 22 on stage 24), the chamber is suitably evacuated employing pumping means 28 and 30 under the control of means 32. The valve 58 is maintained in an open position during initial chamber evacuation in order to evacuate the crucible, but is returned to a closed position when a predetermined vacuum level is reached. Then, heater 54 may be operated to raise the temperature of the iodine crystals whereby iodine vapor is generated for direction toward the sample 22 by means of nozzle 56. When crucible 50 is raised to a desired temperature between 30° and 50° C., valve 58 may be opened as the nozzle 56 is directed towards the desired area of the sample. Bellows 52 accommodates movement of the entire nozzle assembly and crucible relative to the sample, while bellows 96 permits extension and retraction of valve 58 without affecting the vacuum within chamber 26.

Summarizing the method according to the present invention, sample 22 is placed on stage 24 while solid iodine is deposited in crucible 50, after which the chamber 26 is closed and evacuated and gate 62 is opened so that an ion beam 18 can be generated and directed toward the sample. The sample can be positioned by movement of stage 24 in a well understood manner. Nozzle 56 is positioned so that iodine vapor can be directed towards the raster area as crucible 50 is heated by element 54 to an approximate range between 30° C. and 50° C. and valve 58 is opened to permit escape of the iodine vapor. Pattern generator 38 is programmed to deflect ion beam 18 in a raster pattern corresponding to a specific area of sample 22 where material is removed or machined away by ion beam sputtering.

Figure 3:
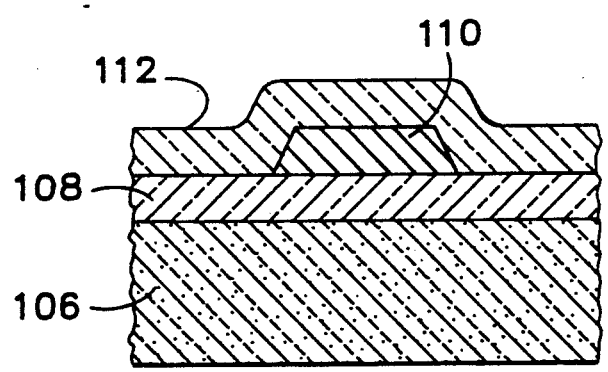
FIG. 3 is a sectional view of a portion of a semiconductor device.
Figure 4:
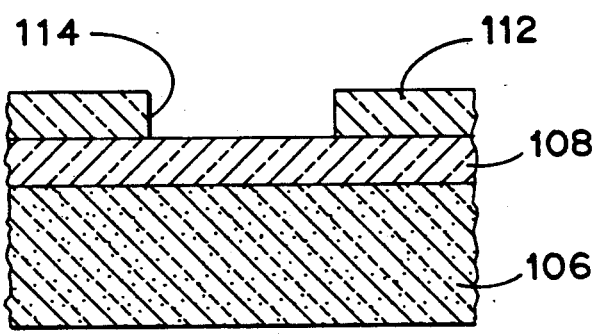
FIG. 4 is a sectional view of the FIG. 3 device having a portion thereof removed by ion beam sputtering.
Figure 5:
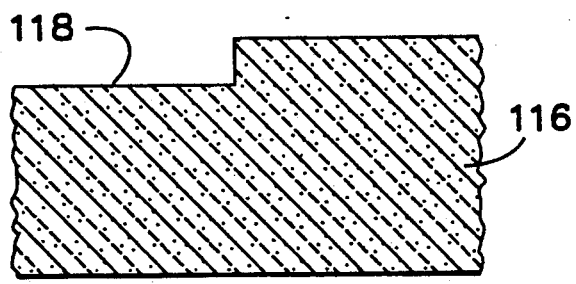
FIG. 5 is a sectional view of a portion of a block of semiconductor material having a portion of the top surface thereof machined away.

Referring to FIGS. 3-5, various portions of a semiconductor integrated circuit device or the like are illustrated as may be microscopically machined in accordance with the present invention. In FIG. 3, body 106 of semiconductor material, e.g. silicon, is covered by a layer 108, suitably comprising an insulating material such as silicon dioxide. A metal conductor 110 which may comprise an aluminum connecting lead is located upon layer 108 and is covered by a second insulating or passivation layer 112. Assuming it is desired to sever or disconnect the conducting metal layer 110, the device may be placed in the apparatus as illustrated in FIG. 1 at the location of sample 22, and ion beam 18 is deflected in a raster pattern corresponding to a rectangular area encompassing metal conductor 110 while iodine vapor is delivered from nozzle 56. FIG. 4 illustrates the device after the machining operation depicting the depression 114 milled away by the scanning ion beam. It should be observed that the underlying insulating layer 108 can also be machined if so desired, but in this case conductor 110 thereabove was removed.

Also, regions of semiconductor material are readily removed. Referring to FIG. 5, illustrating a portion of a block 116 of semiconductor material, an area 118 is milled by means of an ion beam accompanied by iodine vapor directed toward surface 118. The process according to the present invention is suitable for micromachining of various objects in addition to integrated circuit devices, for instance an ion beam according to the present invention may be employed for machining laser facets or optical elements used in directing infrared radiation.

As the iodine vapor is directed toward the surface of a sample (e.g. sample 22 in FIG. 1), iodine is adsorbed on such surface for enabling chemical reaction to take place between iodine and the material of said surface. As the focused ion beam scans a surface of silicon for example, the reaction product of iodine and silicon, i.e., $SiI_4$, is removed. In the case of a semiconductor sample formed of gallium arsenide, $GaI_2$ is generated as well as compounds of arsenic and iodine. When a metal layer such as an integrated circuit conductor formed of aluminum is being removed, a reaction product comprises $AlI_3$.

In the course of removal of surface material by sputtering it is desirable to provide sufficient iodine vapor to the surface to form a saturated monolayer before impingement of the ion beam. If the ion beam is scanned in a regular raster pattern, sufficient iodine vapor is provided so that a given point on the surface of the sample where material is to be removed will receive such monolayer during one raster period, or the time it takes the ion beam to return to a given point in the raster after its prior interception of the same point. The vapor pressure and flux provided in a given area is proportional to the temperature of crucible 50 which is in turn controlled by means of electrically operated heater 54. Such control is conveniently accomplished in an automatic manner.

Although unexpected because of the lower reactivity of iodine compared with chlorine, etching enhancement by approximately a factor of fifteen has been observed for silicon, as well as an enhancement factor of approximately twenty-seven for aluminum. Moreover, the gas assisted physical sputtering achieved in accordance with the present invention is very selective and allows accurate machining of desired areas without as much affect on surrounding areas. Furthermore, the absence of redeposition is observed. Thus, rapid and accurate machining of surfaces including metal conductors in integrated circuit devices is selectively carried out in accordance with the present invention, this even though prior attempts at metal machining employing chlorine or fluorine have produced unsatisfactory results.

Moreover, iodine is a solid at room temperature with a very low vapor pressure and can be handled in the open before placement in a heatable crucible such as crucible 50 hereinbefore described. The crucible can then be placed inside the vacuum system where, even though the temperature of the crucible is raised to produce a higher vapor pressure, the small amount of vapor is exhausted via the vacuum system already present in the focused ion beam apparatus to a remote location and/or gas treatment means. As also noted above, the chamber 26, if operating properly, cannot be opened until the crucible returns to the ambient temperature level at which the iodine vapor pressure is very low. It will be appreciated the method according to the present invention has considerable utility as applied to the rapid modification, repair and analysis of semiconductor devices. It is also of considerable utility in other micromachining applications, but has the advantage of convenience and economy of operation without the dangers of potential toxicity.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. The process of shaping features of a solid object comprising the steps of:
   positioning said object within an enclosed chamber,
   supplying iodine vapor within said chamber so that iodine is adsorbed directly on an exposed surface of said object for enabling chemical reaction between iodine and the material at said surface,
   generating a focused ion beam, and
   directing said ion beam toward said surface for removal through sputtering of a portion of said surface comprising the reaction products of iodine and surface material.

2. The process according to claim 1 wherein said object comprises a semiconductor device.

3. The process according to claim 1 wherein said ion beam is generated employing a liquid metal ion source.

4. The process according to claim 3 wherein said metal comprise gallium.

5. The process according to claim 1 including substantially evacuating said chamber for maintaining the interior of the chamber at a pressure substantially below ambient pressure.

6. The process according to claim 1 including directing said iodine vapor toward the surface of said object.

7. The process according to claim 1 including deflecting said ion beam according to a pattern of movement wherein the configuration of the material removed corresponds to the deflection pattern.

8. The process of shaping features of a semiconductor device comprising the steps of:
   positioning said device on a stage within a substantially gas tight chamber of a focused ion beam system,
   positioning solid iodine within said chamber and heating said iodine to a temperature in excess of 30° C. for generating iodine vapor,
   directing said iodine vapor towards a region of said device where machining is desired for enabling chemical reaction between iodine and material from which said device is formed,
   generating a focused ion beam by means of said focused ion beam system and directing said ion beam toward said region of said device where machining is desired while scanning said beam in a raster pattern over said region for removal through ion beam sputtering of at least a portion of said region, and
   removing reaction products of iodine and material from which said device is formed by evacuating said chamber.

9. The process according to claim 8 wherein the region of said device toward which said iodine vapor and said ion beam are directed for machining said region comprises metallic material.

10. The process according to claim 8 wherein the region of said device toward which said iodine vapor and said ion beam are directed for machining said region comprises insulating material.

11. The process according to claim 8 wherein the region of said device toward which said iodine vapor and said ion beam are directed for machining said region comprises semiconductor material.

12. The process according to claim 8 wherein the region of said device toward which said iodine vapor and said ion beam are directed for machining said region comprises plural layers.

13. The process of shaping features of a solid object comprising the steps of:
   positioning said object within an enclosed chamber,
   supplying iodine vapor within said chamber so that iodine is adsorbed on an exposed surface of said object for enabling chemical reaction between iodine and the material at said surface, wherein said iodine vapor is provided within said chamber by heating solid iodine within said chamber,
   generating a focused ion beam, and
   directing said ion beam toward said surface for removal through sputtering of at least a portion of said surface comprising the reaction products of iodine and surface material.

14. The process of shaping features of a solid object comprising the steps of:
   positioning said object within an enclosed chamber,
   supplying iodine vapor within said chamber so that iodine is adsorbed on an exposed surface of said object for enabling chemical reaction between iodine and the material at said surface, wherein said exposed surface is metal,
   generating a focused ion beam, and
   directing said ion beam toward said surface for removal through sputtering of at least a portion of said surface comprising the reaction products of iodine and surface material.

* * * * *